United States Patent [19]
Van Der Ven

[11] Patent Number: 5,995,232
[45] Date of Patent: Nov. 30, 1999

[54] METHOD OF AND DEVICE FOR INSPECTING A PCB

[75] Inventor: Robert F. L. M. Van Der Ven, Eindhoven, Netherlands

[73] Assignee: U.S. Philips Corporation, New York, N.Y.

[21] Appl. No.: 08/891,820

[22] Filed: Jul. 14, 1997

[51] Int. Cl.⁶ .................................................. G01B 11/00
[52] U.S. Cl. ........................ 356/395; 356/373; 356/385
[58] Field of Search ................................... 356/394, 373, 356/375, 385

[56] References Cited

U.S. PATENT DOCUMENTS

| | | | |
|---|---|---|---|
| 4,269,515 | 5/1981 | Altman | 356/394 |
| 4,978,224 | 12/1990 | Kishimoto et al. | 356/394 |
| 5,011,950 | 4/1991 | Fukuoka et al. | 549/336 |
| 5,011,960 | 4/1991 | Ando et al. | 356/376 |
| 5,166,753 | 11/1992 | Tokura | 356/394 |
| 5,329,359 | 7/1994 | Tachikawa | 356/398 |
| 5,572,313 | 11/1996 | Zheng et al. | |

FOREIGN PATENT DOCUMENTS

| | | |
|---|---|---|
| 319 041 | 6/1989 | European Pat. Off. . |
| 707 226 | 4/1996 | European Pat. Off. . |
| 774 678 | 5/1997 | European Pat. Off. . |
| WO95/14945 | 6/1995 | WIPO . |

Primary Examiner—Frank G. Font
Assistant Examiner—Reginald A. Ratiff
Attorney, Agent, or Firm—Anne E. Barschall

[57] ABSTRACT

A quantity of material is locally deposited on or removed from a substantially flat substrate of a circuit board. The quantity is inspected by carrying out a first measurement of a level of a surface of the material in a direction transversely of the substrate. At least two further measurements are performed of a further level of the substrate in said direction in at least two further locations where the material has not been deposited or removed. A reference level of the substrate is calculated by interpolation between the further measurements to a location of the first measurement. The quantity of material is inspected on the basis of a difference between the first measurement and the reference level.

11 Claims, 2 Drawing Sheets

METHOD OF AND DEVICE FOR INSPECTING A PCB

The invention relates to a method of inspecting a quantity of a material locally deposited on or removed from a substantially flat substrate of a circuit board according to the preamble of claim 1.

The invention also relates to a device for carrying out such a method.

A method and device of this kind are known from U.S. Pat. No. 5,011,960. This publication concerns the inspection of conductor tracks on a printed circuit board. The tracks are inspected for sufficient thickness, i.e. it is checked whether the quantity of material in a column of conductive material suffices at the area of a conductor.

The level of the surface of the material is optically measured. This level is subsequently compared with a threshold level derived from the level of the substrate. The level of the substrate is also optically measured.

U.S. Pat. No. 5,011,960 describes that diffuse light reflection from the substrate introduces errors in the measurement of the level of the substrate in the vicinity of curved parts of the substrate. The publication discloses how adverse affects of these errors can be compensated by adapting the distance between the threshold level and the level of the substrate in dependence on the level of the substrate.

However, it has been found that the local curvature of printed circuit boards may be such that the inspection of the quantity of material may also be insufficiently reliable in other respects, notably if the thickness of the material is small.

It is inter alia an object of the invention to provide a method which enhances the reliability of the inspection of the quantity of material.

The method according to the invention is characterized in that the determination of the reference level includes the steps of carrying out at least two further measurements of a further level of the substrate in said direction in at least two further locations in which the material has not been deposited or removed, calculating the reference level of the substrate by interpolation between the further measurements to a location of the first measurement. The reference level of the substrate underneath the material is thus accurately estimated. It has been found that the adverse effects of local curvature of a printed circuit board on the inspection of quantities of material are thus substantially mitigated. In this context interpolation is to be understood to mean any method of calculation of the reference level which utilizes a mathematical formula in the location coordinates which is adapted so that it constitutes a faithful approximation of the measured levels, for example a least-squares fit, or a function passing exactly through all measured levels.

In a version of the method according to the invention the printed circuit board is provided with a pattern of conductor pads in which the material is locally provided on or removed from the pattern of conductors, and in which the further measurements are carried out on a surface of the pattern of conductor pads. The interpolation offers the best results if the further measurement utilizes the surface of sufficiently large conductor pads which are not covered by the material. These conductor pads often are not situated in the direct vicinity of the material whose quantity is to be inspected. The interpolation nevertheless enables a reliable estimate to be made of the reference level.

The measurement of the level preferably utilizes optical techniques, as known per se from the prior art, which use the return of light from the surface (in the case of triangulation, the return of light is dispersion by the surface and reflection is concerned in the case of interference measurement). At least two measurements are required for the interpolation. This number suffices if the location of the material is exactly aligned with the locations of these two measurements. Preferably, however, use is made of an interpolation with a second-order polynomial, requiring at least six measurements.

A version of the method according to the invention includes the steps of providing design data which define where conductor pads must be present and where the material is to be deposited on the substrate;

providing the conductor pads and the material on the substrate in conformity with the design data;

deriving from the design data a location where the first measurement is to be performed;

selecting from the design data a location for the further measurement.

The design data (CAD) of the circuit board are thus used to preselect the locations in which the further measurements are to be performed. Regions having a level that can be reliably measured can thus be selected for these measurements, without much time being required for each circuit board to be inspected.

The invention also relates to a device for carrying out the method.

These and other aspects and advantages of the invention will be described in detail hereinafter with reference to the Figures. Therein:

Figure 1:
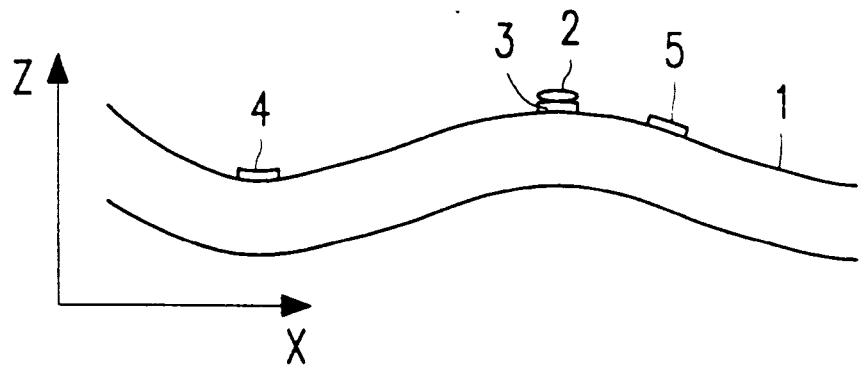
FIG. 1 is a side elevation of an embodiment of a circuit board.

FIG. 1 is a diagrammatic side elevation of an embodiment of a circuit board (to be referred to hereinafter as "the PCB"). The Figure shows a substrate with a surface 1, a number of conductors 3, 4, 5 and a material 2 (for example, solder paste) deposited on one of the conductors (3). During the manufacture of the PCB it must be checked whether sufficient material 2 has been deposited on the conductor 3.

The PCB is shown with exaggerated curvature or warping. In practice a PCB will be substantially flat with slight deviations (less than one percent) from a perfectly flat surface which are caused by warping of the PCB. FIG. 1 shows an x-direction which on average extends parallel to the PCB and a z-direction which extends perpendicularly to the PCB.

Figure 2:
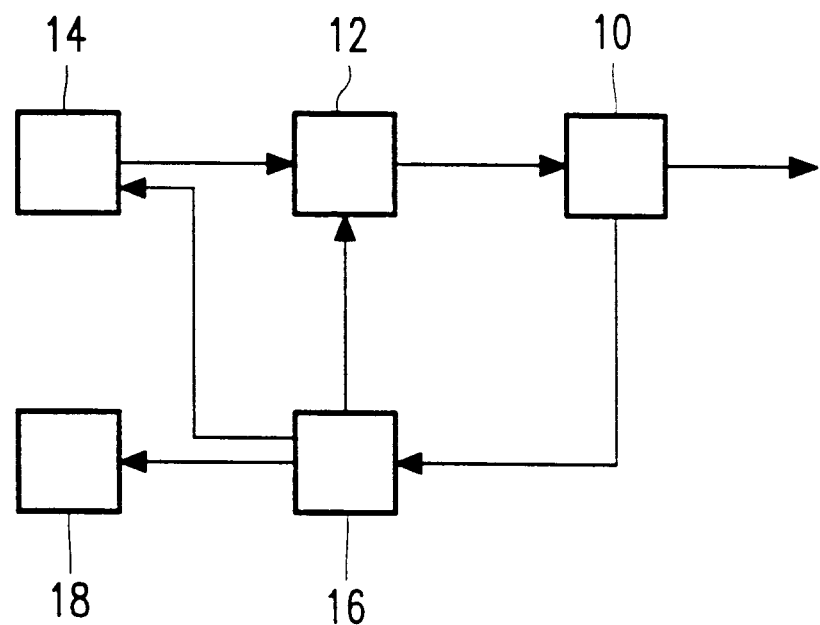
FIG. 2 shows a device for inspecting a circuit board.

FIG. 2 shows a block diagram of a device for inspecting a PCB. The block diagram comprises a height meter 14 which is coupled to a memory 12 which itself is coupled to a computer 10. The computer 10 is coupled to a control unit 16, control outputs of which are coupled to the height meter 14, the memory 12 and a movement actuator 18.

A PCB is introduced into the device during operation. The height meter 14 measures the level of the surface of the PCB one line after the other. A line extends, for example in the x-direction of FIG. 1 and for a series of locations on the line it is measured how high the surface of the PCB, and what is provided thereon, extends in the z-direction of FIG. 1. The height meter 14 can utilize a known optical height measuring technique, for example as described in U.S. Pat. No. 5,011,950 or in U.S. Pat. No. 5,329,359. Results of the level measurement are stored in the memory 12.

The device has CAD data available which indicates where various features, such as conductor tracks and quantities of solder paste, must be present on the PCB. If necessary, the position of a number of fiducials on the PCB is measured, so that the computer 10 can calculate the position and orientation of the PCB relative to the height meter, thus ensuring that an exact relationship can be established between locations expressed in terms of the CAD data and corresponding locations where the level on the PCB is measured. Measurement of the position of the fiducials can be dispensed with if the PCB is accurately aligned in the device.

The computer 10 starts the measuring process. The control unit controls the movement actuator 18 in such a manner that the PCB is displaced relative to the height meter 14; during the displacement the computer causes the height meter 14 to measure the level at the series of points along the line extending transversely of the movement direction. An address signal for the memory 12 is updated in synchronism with the measurement, so that a 1:1 correspondence exists between the locations in the memory 12 and locations on the PCB.

The computer 10 subsequently performs the inspection. The following steps are carried out for a quantity of material 2 to be inspected. The level measurement for a number of locations in the vicinity of the location of the material to be inspected is read from the memory 12. Concerned are the locations 4, 5 where no material is present. On the basis of the levels read an interpolation is performed to calculate a reference level at the area of the material 2 to be inspected. A measured level at the location of the material 2 is read from the memory 12. The difference with respect to the calculated reference level is determined. This yields an estimate in respect of the quantity of material 2 in a column at the location of the material to be inspected. If this estimate exceeds a threshold, the computer 10 reports that a sufficient quantity of material 2 has been found.

Figure 3:
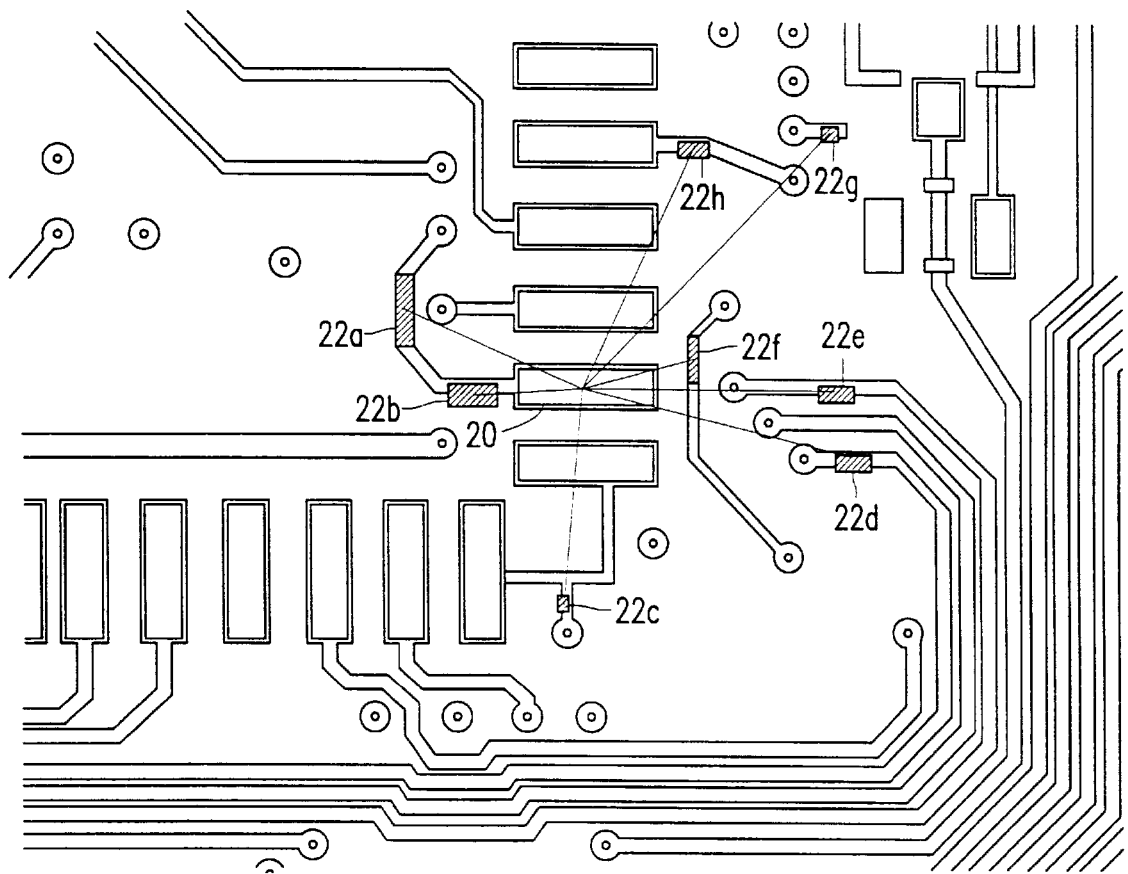
FIG. 3 is a plan view of a circuit board.

FIG. 3 shows a plan view of a part of an embodiment of a PCB. Conductor tracks provided thereon are shown in dark. The Figure shows a location 20 where material must be present and a number of locations 22a–h which are used for the interpolation.

The interpolation utilizes, for example a second-order polynomial $P(x,y)$ in the coordinates x,y along the surface of the PCB.

$$P(x,y) = a_{00} + a_{10}x + a_{01}y + a_{20}x^2 + a_{11}xy + a_{02}y^2$$

Other polynomials, for example of higher or lower order, for other functions of x,y, instead of the powers of x,y, can be used without departing from the scope of the invention. The coefficients $a_{ij}$ of the polynomial $P(x,y)$ are chosen, for example so that a sum of the deviations $$\Sigma_k (P(x_k,y_k) - h_k)^2$$

is minimized ($x_k, y_k$ are the locations wherebetween interpolation takes place and $h_k$ denotes the associated level measurements). For the determination of the six coefficients $a_{ij}$, for example eight measured levels $h_k$ are used. The reference level is then $P(x_0, y_0)$ for the coordinates $x_0, y_0$ of the location in which the quantity of material is measured.

Without departing from the scope of the invention, the coefficients $a_{ij}$ can also be interpolated in other ways, for example by measuring levels $h_k$ in as many locations $x_k, y_k$ as there are coefficients $a_{ij}$, and by subsequently solving the coefficients $a_{ij}$ from the set of equations $P(x_k, y_k) = h_k$. If necessary, for this purpose an appropriate number of locations is selected by omitting superfluous locations having the highest and lowest levels. Furthermore, it is not necessary either to determine the coefficients $a_{ij}$ explicitly; the desired interpolated levels can in principle be determined directly from the measured levels $h_k$.

Furthermore, instead of the sum of the squares, the maximum deviation $$MAX_k |P(x_k, y_k) - h_k|$$

can be minimized.

The coordinates $x_0, y_0$ of the locations to be inspected and the coordinates $x_k, y_k$ of the locations used for the interpolation are preferably determined on the basis of CAD (Computer Aided Design) data. The CAD data specifies the course of the conductor tracks on the PCB and in which locations solder paste is to be provided. During the manufacture of the PCB the conductor tracks and the solder paste are provided under the control of the CAD data. From the CAD data, therefore, it follows where solder paste is to be provided and where not (for example, solder paste is provided on the contact pads for ICs). The locations where the CAD data specify the presence of solder paste must be inspected.

Subsequently, for each location to be inspected a number of locations is selected from the CAD data for interpolation. Preferably, locations are selected which are situated in the vicinity of the location to be inspected and are uniformly distributed in all directions from the location to be inspected. Moreover, preferably locations are selected with a conductor surface which has more than a minimum surface which is not to be covered by the material to be inspected.

This selection of the location is preferably performed once prior to the manufacture of a series of PCBs of the same type. During the execution of the inspection, the position of each PCB relative to the device is accurately determined, because the relationship between the CAD coordinates on the PCB and the actual locations on the PCB is fixed. Subsequently, the inspection is performed as described above.

This inspection can be carried out in a variety of alternative ways without departing from the scope of the invention. For example, the level measured at the location to be inspected can be compared directly with a threshold level, instead of an inspection where first the difference is determined between the measured level and the reference level. In that case the threshold level follows from the reference level by adding a threshold value thereto.

Alternatively, the level at each location may be compared with a number of different predetermined threshold levels. This may be used for example in the following way. One considers a predetermined window of locations containing a region where material should be deposited. For each threshold level computes the number of a collection of locations (that is, the area) where the measured level exceeds that threshold level inside the window. Subsequently, one determines the reference level and selects the area determined for a particular threshold level exceeding the reference level by a predetermined amount; e.g. if the measured level is 150 units of measurement, one may use the area determined for a threshold of 155 units of measurement. The level measurements can be executed at high speed, without interruption for computing the reference level and the area covered by the material can be estimated with an adaptive threshold without the need to store all measured levels in the time interval until the reference level has been computed.

More generally, apart from the area a number of moments $M_{n,m}$ may be computed for each threshold level. A moment $M_{n,m}$ is a sum over locations in the window of a power $x^n m^m$ of the coordinates (x,y) of those locations, restricted to locations where the measured level exceeds the threshold level for which the moment is computed. The area A is equal to $M_{00}$ and the coordinates of the center of mass <x>, <y> follow from <x>=$M_{10}/M_{00}$<y>=$M_{01}/M_{00}$; higher order moments (larger m,n) may be used to provide information about the shape of the material. One selects the moment $M_{n,m}$ determined for a particular threshold level exceeding the reference level by a predetermined amount once the reference level has been computed. Thus, more detailed information about the material is obtained without the need to interrupt the measurements or the need to store the measured levels for all of the locations.

The moments computed for various threshold levels may also be used to compute the volume of deposited material, by summing over the areas determined for differential threshold levels starting from a threshold level that is a predetermined amount above the reference level. This summing may assign equal weights to each threshold level, or threshold level dependent weights for example if the threshold levels are not equally spaced. Similarly, the center of mass of the deposited material may be determined. This also avoid the need to store measurements for all locations. In a more refined determination, one may correct this computation by accounting for the contribution to the volume due to the location dependence of the reference level.

It is also possible to sum the level measurements in a number of locations of a contiguous piece of material in order to inspect the total quantity of material. The sum of the reference levels for the various locations involved is then subtracted from the sum obtained. Summing is preferably restricted to locations in which the measured level of the material projects for more than a threshold value beyond the reference level interpolated for the relevant location.

In the case of solder paste on a conductor surface, it can also be checked that the material does not project from the conductor surface. It is thus ensured, for example that the solder paste on the connection pad for a pin of an integrated circuit does not extend as far as a neighbouring connection pad.

For this inspection, for example it is sampled in which locations the measured level of the material projects for more than a threshold value beyond the reference level interpolated for the relevant location. The minimum and the maximum x-value are determined underneath these locations in as far as these locations are situated within a predetermined area in which the conductor surface is situated. These minimum and maximum x-values are subsequently compared with the minimum and maximum x-values of the conductor surface, for example as they follow from CAD data. Similarly, the minimum and maximum y-values are inspected. In the case of rectangular conductor surfaces, the x-direction and the y- direction are then chosen to extend according to the sides of the rectangle.

If at least one of the minimum and maximum x-values and y-values deviates from those of the conductor surface, a potential error is signalled so that the PCB can be further inspected or be isolated.

For locations where the solder paste reaches too far, subsequently it can be checked separately, if desired, whether the solder paste reaches as far as a next solder pad.

If the locations to be inspected are known in advance and if it is also known which locations can be used for the interpolation, the control unit 16 can limit the writing of level measurements into the memory 12 to these locations. In that case a smaller memory 12 can be used.

If a number of locations are inspected which are situated in the vicinity of one another, it suffices to use a single set of locations wherebetween interpolation takes place for the calculation of the reference level. The reference levels for all of the various locations to be inspected can then be determined by means of a single set of measurements and interpolation coefficients, which set is determined once on the basis of the measured levels of the set of locations. This reduces the overall amount of time and memory capacity required for the interpolations.

Even though in the described example interpolation takes place between locations where conductor tracks or pads are situated, interpolation can also be performed between other locations, for example locations where the substrate is exposed, or between the two types of locations; in that case correction is made for the height of the conductor tracks. However, the interpolation preferably utilizes the conductor tracks or pads, because the reference level can then be accurately determined. As a result of the interpolation, this is also the case if the level of conductor tracks or pads which are situated comparatively far from the location to be inspected must be used for the interpolation because no suitable (i.e. sufficiently large unexposed) conductor tracks or pads are situated near the location to be inspected.

Furthermore, the invention is not restricted to the inspection of a quantity of solder paste. A variety of materials provided on a variety of surfaces of the PCB can thus be inspected. Even the quantity of material removed (for example, during etching) can be determined in this manner.

I claim:

1. A method of inspecting a quantity of a material locally deposited on or removed from a substantially flat substrate of a circuit board, which method includes the steps of carrying out a first measurement of a level of a surface of the material in a direction transversely of the substrate;

determining a reference level of the substrate underneath the material;

inspecting the quantity on the basis of a difference between the first measurement and the reference level, characterized in that the determination of the reference level includes the steps of carrying out at least two further measurements of a further level of the substrate in said direction in at least two further locations in which the material has not been deposited or removed, calculating the reference level of the substrate by interpolation between the further measurements to a location of the first measurement.

2. A method as claimed in claim 1, in which the printed circuit board is provided with a pattern of conductor pads in which the material is locally deposited on or removed from the pattern of conductors, and in which the further measurements are carried out on a surface of the pattern of conductor pads.

3. A method as claimed in claim 2, in which the first measurement and the further measurements are carried out on the basis of the return of light from the surface of the material and the pattern of conductor pads, respectively.

4. A method as claimed in claim 1, in which the further measurements comprise at least six further measurements in six different locations, which method interpolates with a polynomial of at least the second order in surface coordinates on the substrate.

5. A method as claimed in claim 1, which includes the steps of providing design data which defines where conductor pads must be present and where the material is to be deposited on the substrate;

providing the conductor pads and the material on the substrate in conformity with the design data;

deriving from the design data a location where the first measurement is to be performed;

selecting from the design data a location for the further measurement.

6. A device for inspecting a quantity of material locally deposited on or removed from a substantially flat substrate of a circuit board, which device includes level measuring means for measuring material and substrate levels in a direction transversely of the substrate;

quantity inspection means which are coupled to the level measuring means in order to receive a first measurement of a level of a surface of the material, and also includes reference determining means for determining a reference level of the substrate underneath the material;

characterized in that the reference determining means are arranged to receive at least two further measurements of two further levels of the substrate in said direction in at least two further locations where the material has not been deposited or removed, and that the reference determining means include interpolation means for calculating the reference level of the substrate by interpolation between the further measurements to a location of the first measurement.

7. A device as claimed in claim 6, for inspection of printed circuit boards provided with a pattern of conductor pads in which the material is locally deposited on or removed from the pattern of conductors, the level measuring means in said device being arranged to carry out the further measurements on a surface of the pattern of conductor pads.

8. A device as claimed in claim 7, in which the level measuring means are arranged to measure the levels on the basis of the return of light from the surface of the material and the pattern of conductor pads, respectively.

9. A device as claimed in claim 6, in which the her measurements comprise at least six further measurements in six different locations, and in which the interpolation means are arranged to interpolate with a polynomial of at least the second order in surface coordinates on the substrate.

10. A device as claimed in claim 6, which includes receiving means for receiving design data which defines where conductor pads must be present and where the material is to be deposited on the substrate, and in which the level measuring means are arranged to derive from the design data a location of the first measurement and to select the location for the further measurement on the basis of the design data.

11. A device as claimed in 6, comprising means for computing, for each of a number of different threshold levels a set of one moment of a region of locations wherein the measured level exceeds that threshold level, the reference level being used to select one or more of these sets of at least one moment.

* * * * *